US012575207B2

(12) United States Patent
Wakashima et al.

(10) Patent No.: US 12,575,207 B2
(45) Date of Patent: Mar. 10, 2026

(54) IMAGE SENSOR AND IMAGE CAPTURING APPARATUS

(71) Applicant: CANON KABUSHIKI KAISHA, Tokyo (JP)

(72) Inventors: Shunichi Wakashima, Tokyo (JP); Kohei Okamoto, Kanagawa (JP); Koichi Fukuda, Tokyo (JP); Yumi Takao, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 519 days.

(21) Appl. No.: 18/152,248

(22) Filed: Jan. 10, 2023

(65) Prior Publication Data

US 2023/0230990 A1     Jul. 20, 2023

(30) Foreign Application Priority Data

Jan. 18, 2022     (JP) ................................. 2022-005822

(51) Int. Cl.
　　*H10F 39/00*　　(2025.01)
　　*H10F 39/10*　　(2025.01)
(52) U.S. Cl.
　　CPC ....... *H10F 39/8063* (2025.01); *H10F 39/103* (2025.01)
(58) Field of Classification Search
　　CPC .. H10F 39/8063; H10F 39/103; H10F 39/807; H10F 39/813; H10F 39/8033; H10F 39/8023; H10F 39/8027; H10F 39/8037
　　See application file for complete search history.

(56) References Cited

U.S. PATENT DOCUMENTS

2020/0273894 A1*　8/2020　Inui ..................... H10F 39/8063

FOREIGN PATENT DOCUMENTS

| JP | 58-24105 A | 2/1983 |
| JP | 2014-107835 A | 6/2014 |
| JP | 2017126680 A | 7/2017 |
| JP | 2020085920 A | 6/2020 |
| JP | 2020141122 A | 9/2020 |

* cited by examiner

*Primary Examiner* — Thanh Luu
*Assistant Examiner* — Mai Thi Ngoc Tran
(74) *Attorney, Agent, or Firm* — Cowan, Liebowitz & Latman, P.C.

(57)　　　　　　ABSTRACT

An image sensor comprises a plurality of pixels, and signals are read out in units of rows. The plurality of pixels comprise a plurality of microlenses, and for each microlense, a pair of first semiconductor regions formed at a first depth; a pair of second semiconductor regions formed at a second depth deeper than the first depth; and a plurality of connecting regions that connect the first semiconductor regions and the second semiconductor regions, respectively. Pixels having a first arrangement have the first and second semiconductor regions arranged in a row direction, pixels having a second arrangement have the first semiconductor regions arranged in a column direction and the second semiconductor regions arranged in the row direction. A crosstalk ratio between the first semiconductor regions in the second arrangement is made smaller than that in the first arrangement.

11 Claims, 16 Drawing Sheets

F I G.   3
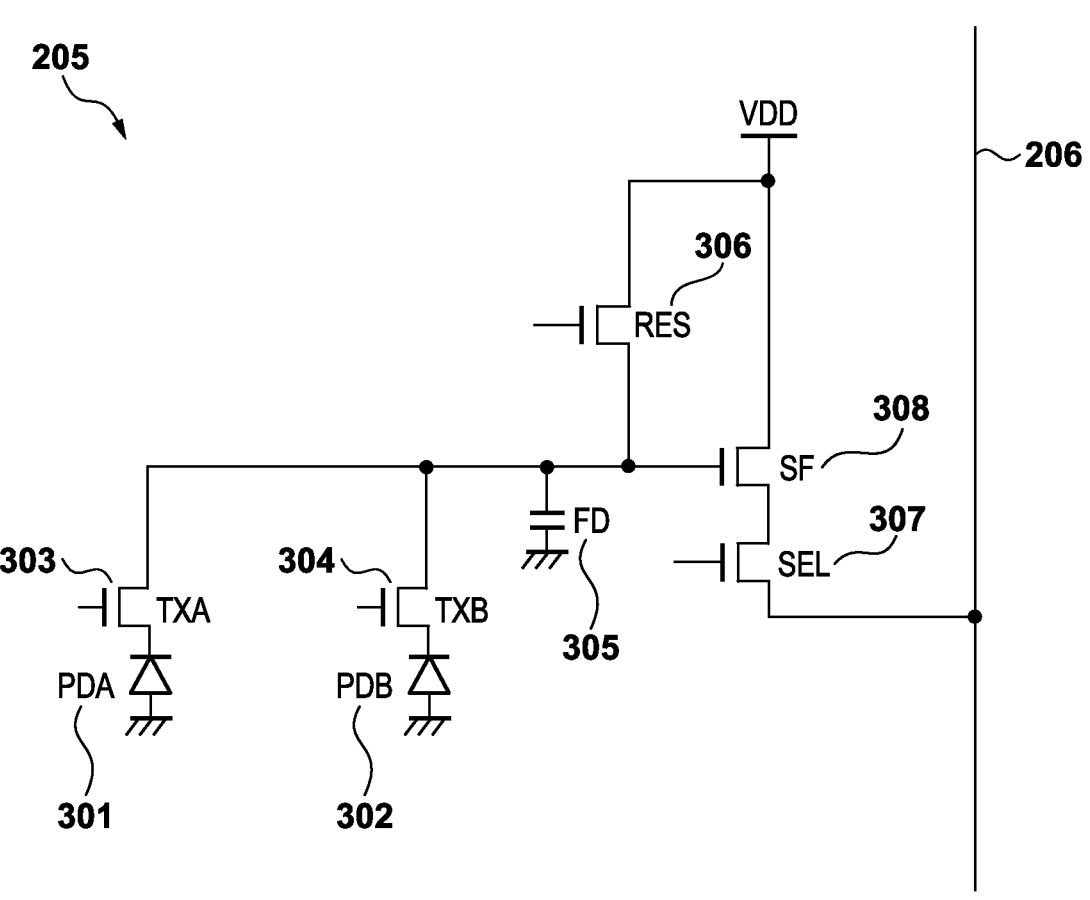

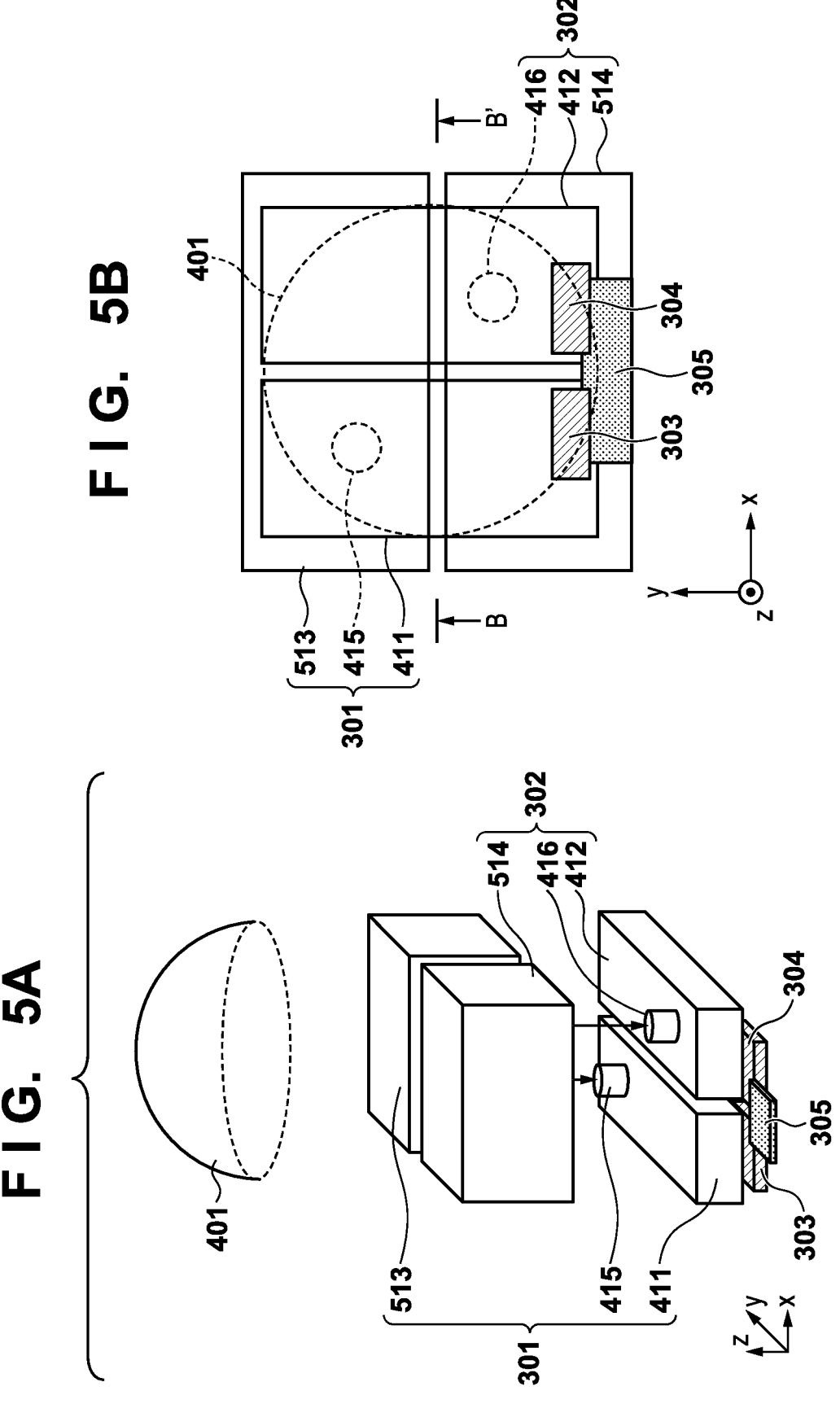
F I G. 5A
F I G. 5B

F I G.  6
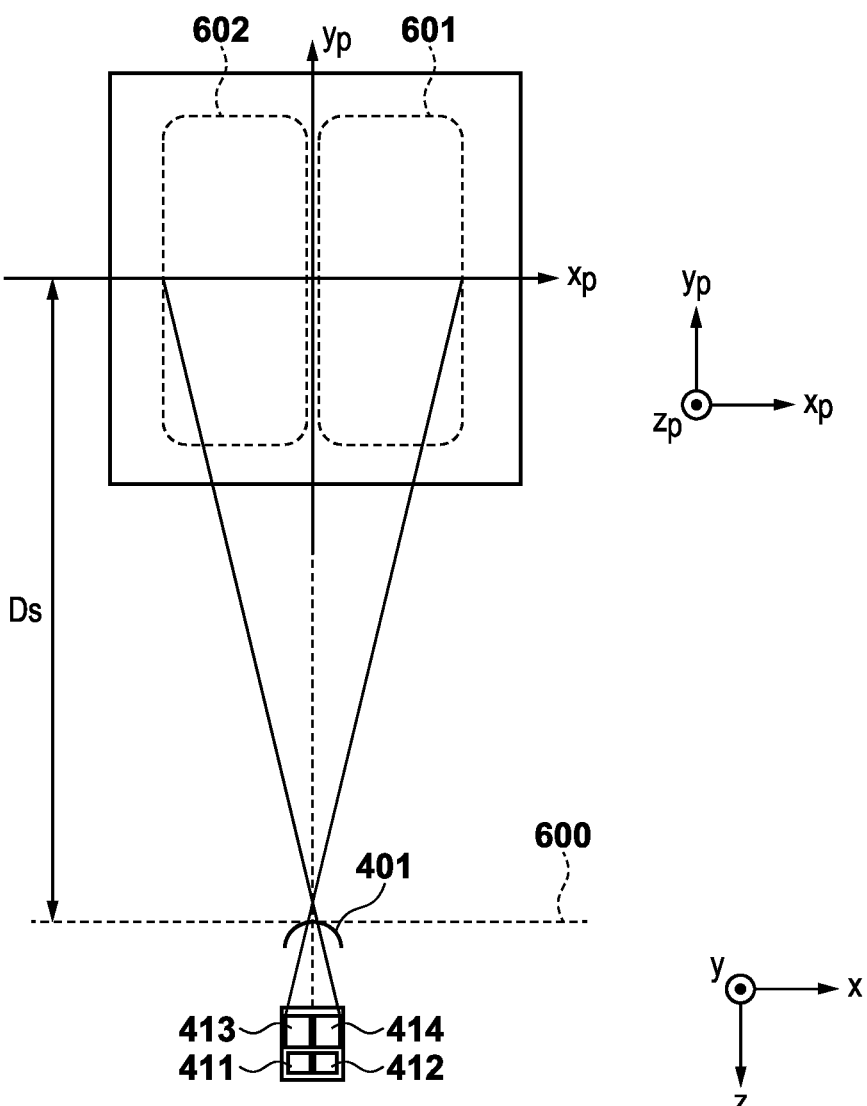

F I G. 7
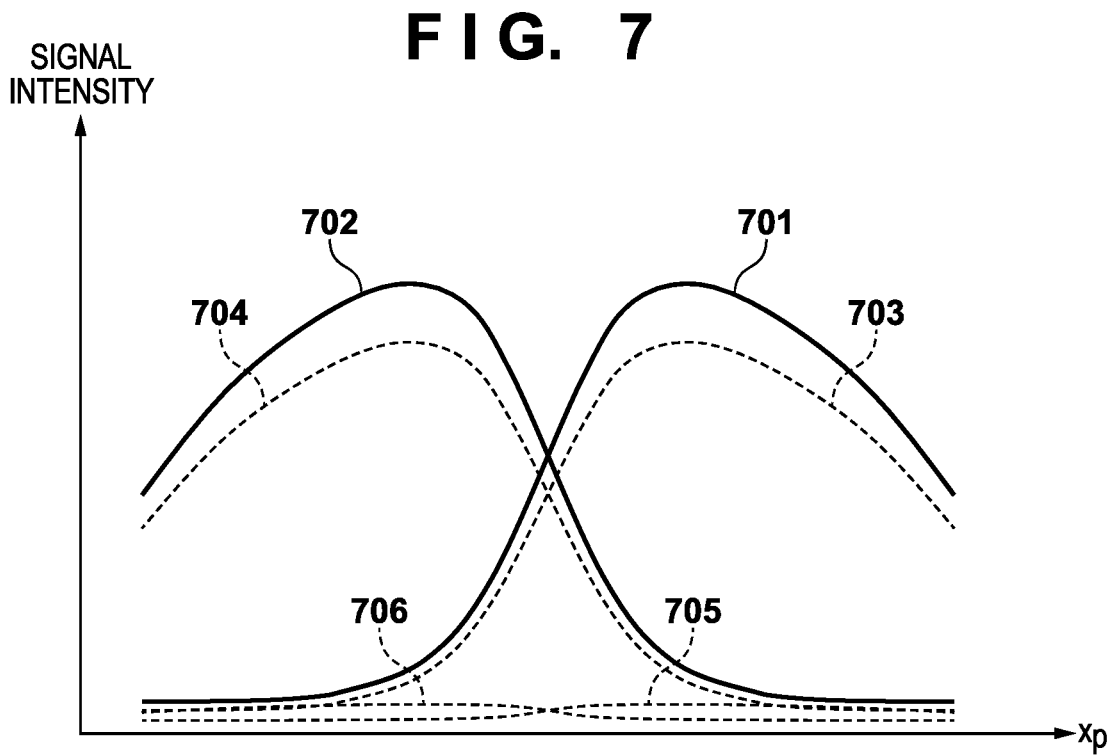
F I G. 8

FIG. 9

F I G.  10
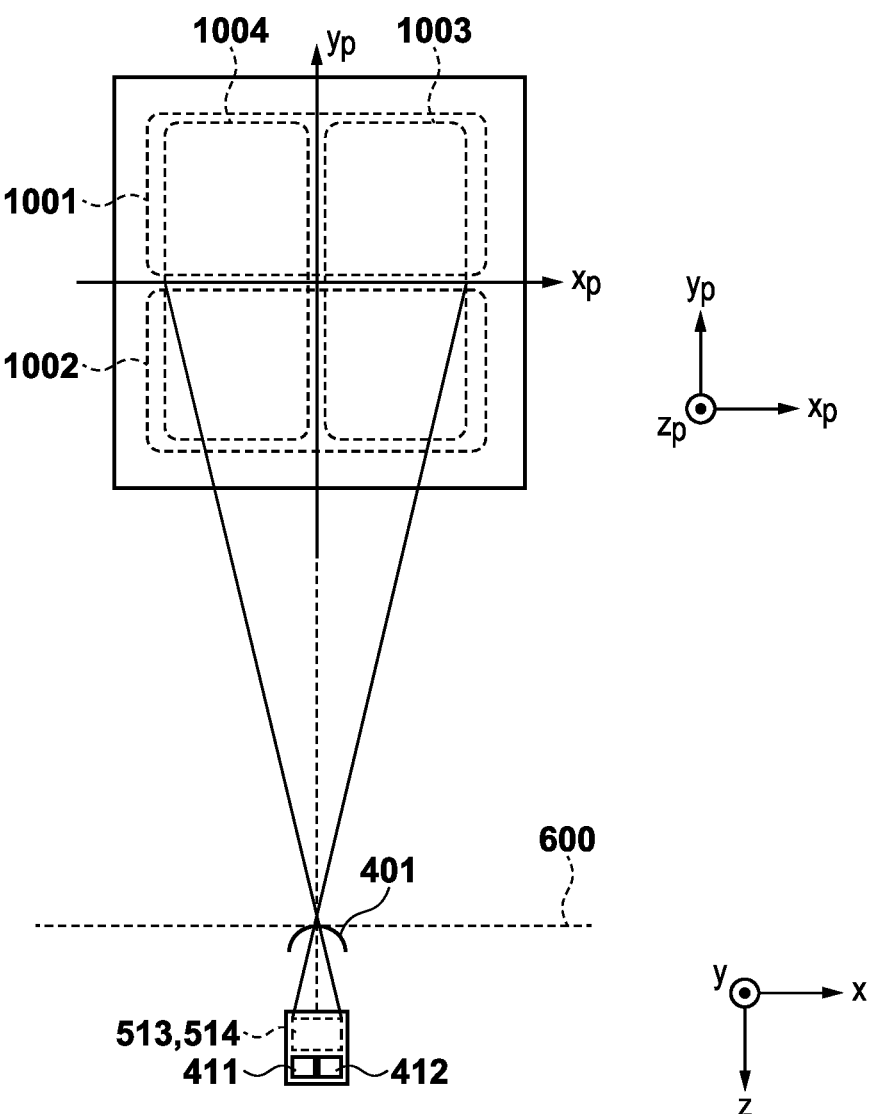

F I G.  11
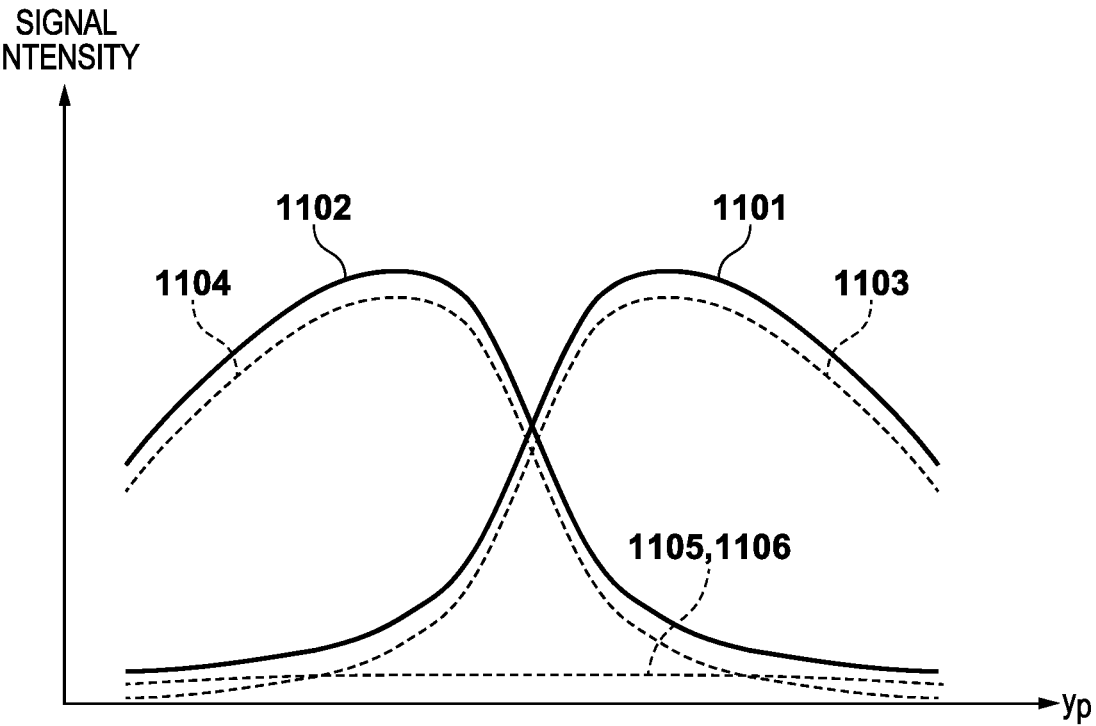

F I G.  14
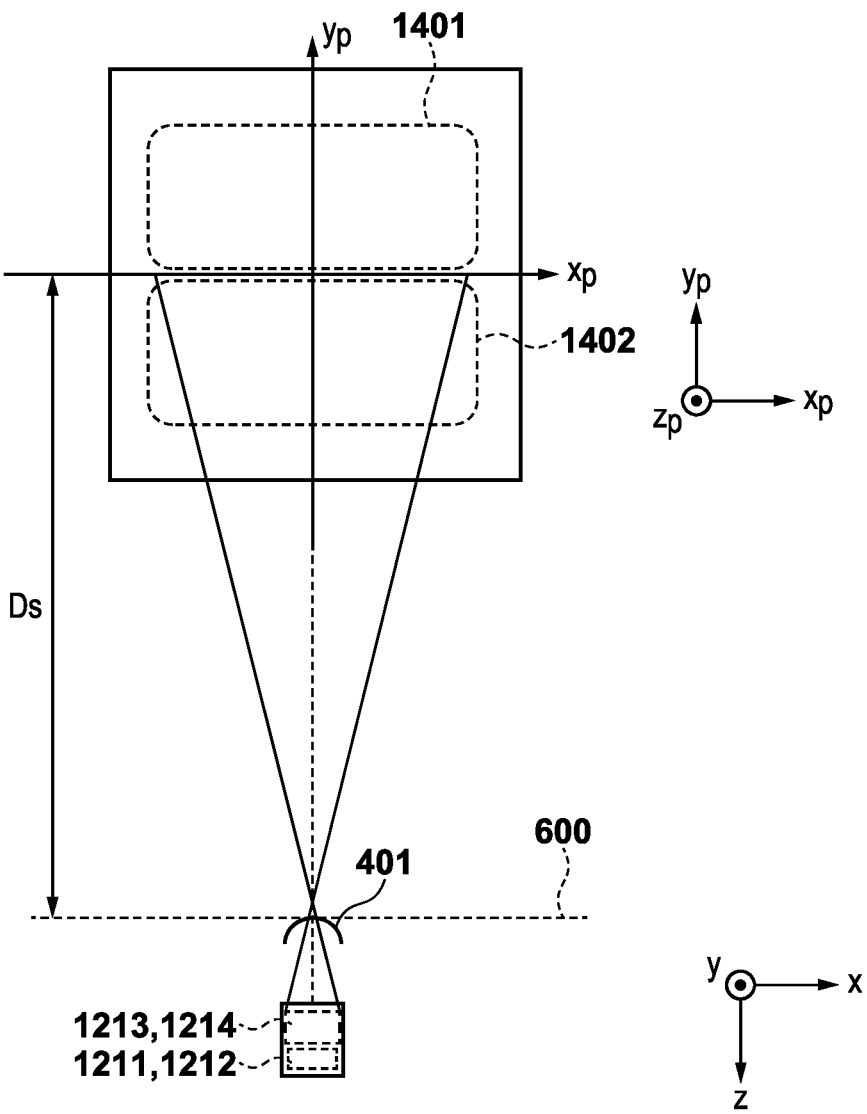

F I G. 15
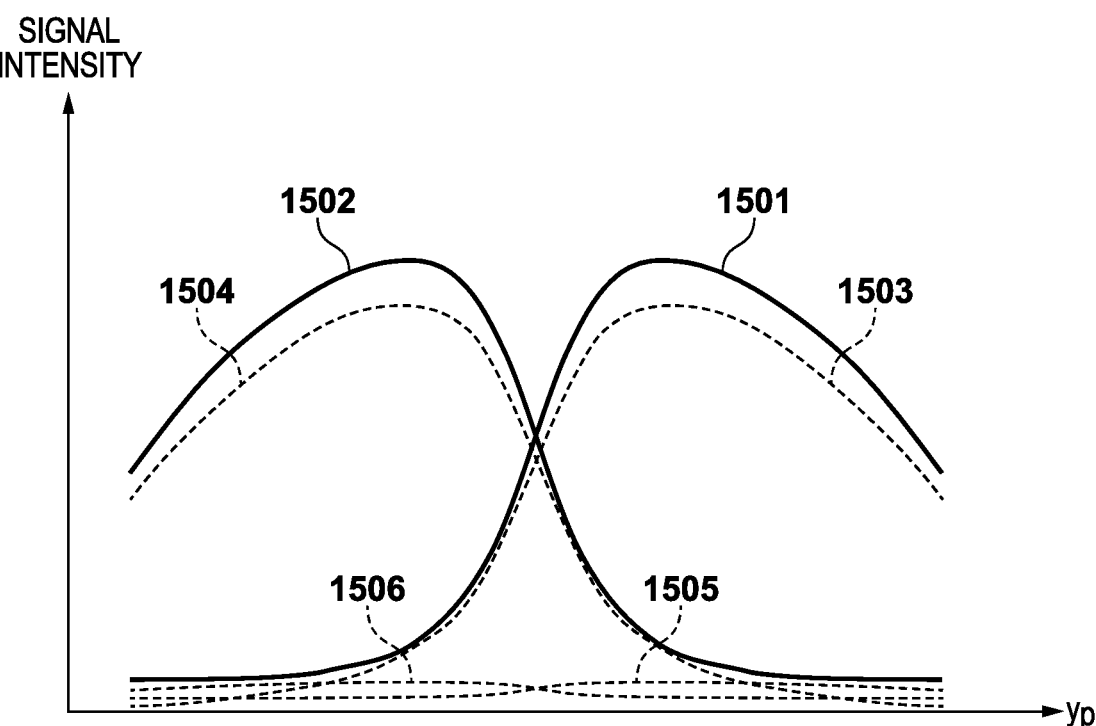

F I G.  16
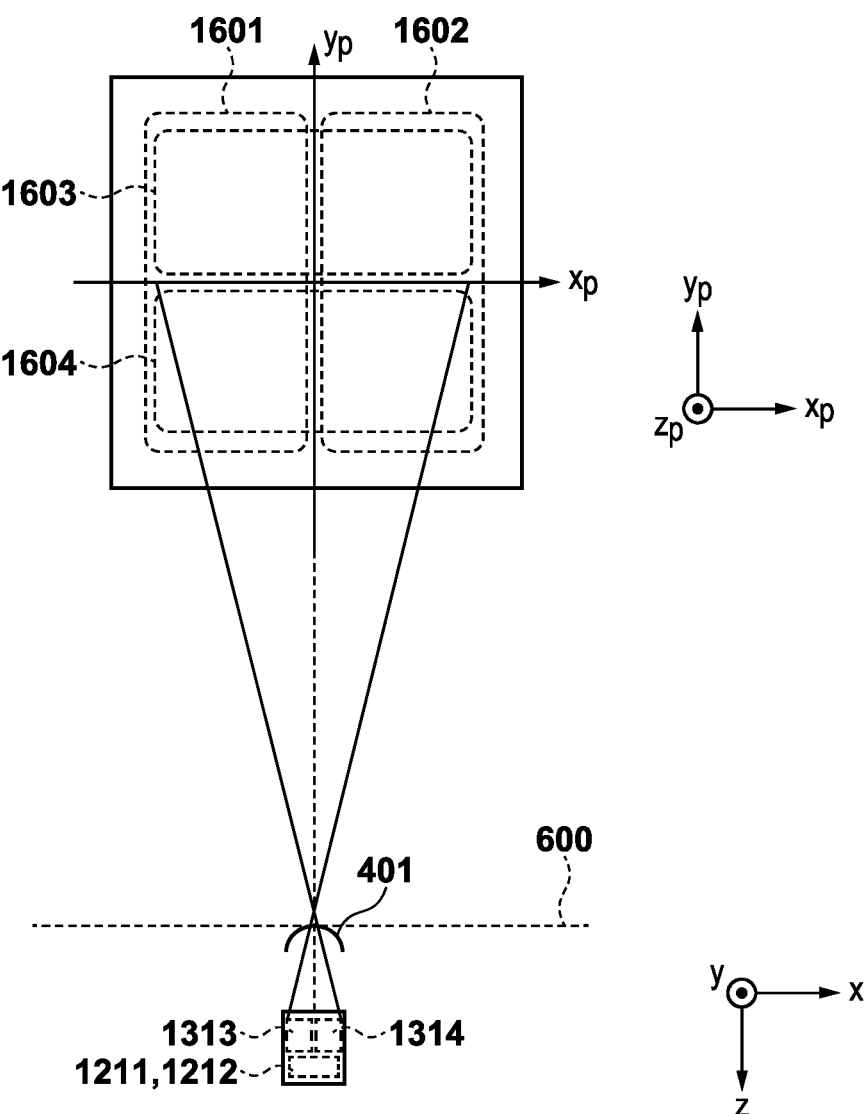

F I G.  17
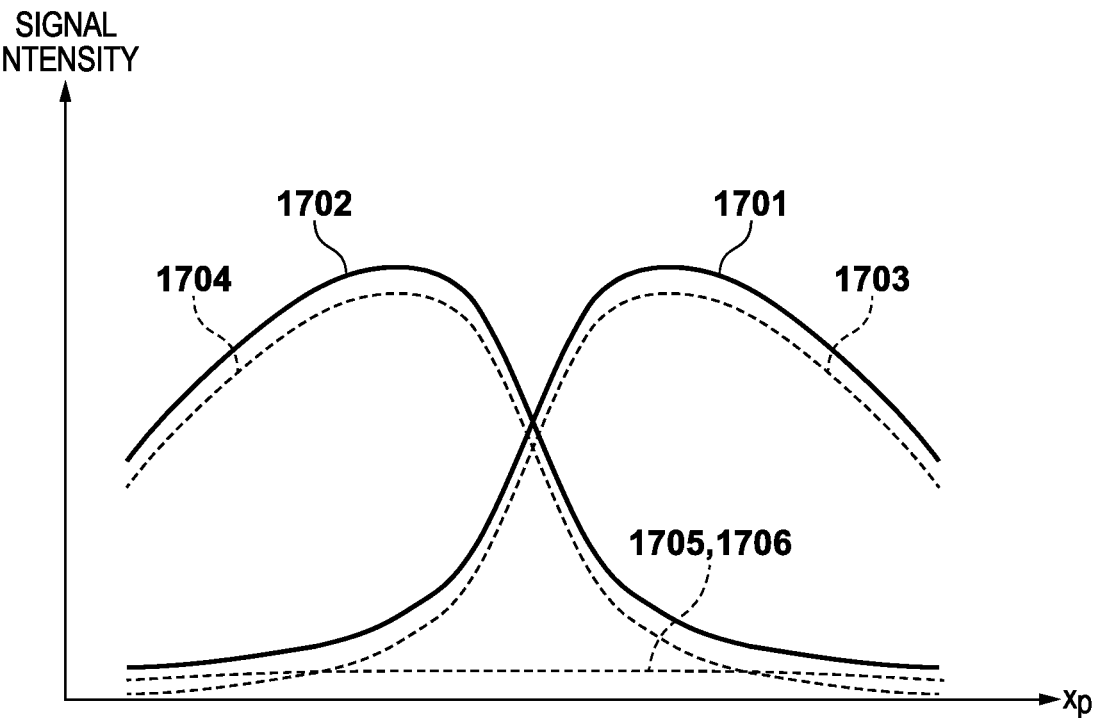

IMAGE SENSOR AND IMAGE CAPTURING APPARATUS

BACKGROUND OF THE INVENTION

Field of the Invention

The present invention relates to an image sensor in which a plurality of pixel units each having a plurality of photo-electric conversion portions are two-dimensionally arranged, and an image capturing apparatus equipped with the image sensor.

Description of the Related Art

As one of the focus detection methods performed in an image capturing apparatus, a so-called on-imaging plane phase difference method in which a pair of pupil division signals are acquired using the focus detection pixels formed in an image sensor and focus detection of the phase difference method is performed using the pair of pupil division signals is known.

As an example of such an on-imaging plane phase difference method, an image capturing apparatus using a two-dimensional image sensor in which one microlens and a plurality of divided photoelectric conversion portions are formed in each pixel is disclosed in Japanese Patent Laid-Open No. 58-24105. The plurality of photoelectric conversion portions are configured to receive light transmitted through different regions of the exit pupil of an imaging lens via one microlens, thereby pupil division is realized. By calculating the image shift amount from the phase difference signals, which are the signals of respective photoelectric conversion portions, phase difference focus detection can be performed. Further, an image can be acquired from an image signal obtained by adding signals of respective photoelectric conversion portions for each pixel.

In such an image sensor, if the image sensor has a configuration in which a plurality of photoelectric conversion portions are arranged in the horizontal direction within a pixel and the pupil division direction is the horizontal direction, for example, in a case where the subject has a stripe pattern in the horizontal direction, parallax may be less likely to appear, and focus detection accuracy may decrease.

To address this problem, Japanese Patent Laid-Open No. 2014-107835 discloses a technique for improving focus detection accuracy by adopting two pixel arrangement directions with respect to each microlens in order to make the pupil division directions to two. Further, Japanese Patent Laid-Open No. 2014-107835 discloses that a leaked amount of charge to adjacent pixels is made different between a structure for separating vertically adjacent pixels and a structure for separating horizontally adjacent pixels. With this structure, supersaturated charge generated beyond the saturation amount of pixel is intentionally leaked to another pixel arranged in the predetermined direction and accumulated there, so that even if one pixel is saturated, horizontal or vertical phase difference focus detection can be performed.

However, in the image sensor in Japanese Patent Laid-Open No. 2014-107835, there is no disclosure of a phenomenon in which charge leaks to adjacent pixels even if the pixels are not saturated (hereinafter referred to as "charge crosstalk").

In addition, in a case where the horizontal direction and the vertical direction are mixed as the separation directions of a plurality of pixels each corresponding to each microlens, in an image sensor that sequentially reads out signals in units of rows, signals of pixels whose separation direction is the vertical direction which is orthogonal to the row direction are read out at different timings. Therefore, the focus detection performance of the phase difference detection method may be lower in a case where the signals read out from the vertically separated pixels are used than in a case where the signals read out from pixels separated in the horizontal direction, which is the row direction, are used.

SUMMARY OF THE INVENTION

The present invention has been made in consideration of the above situation, and in a case where phase difference focus detection is performed for each division direction using signals output from a plurality of pixels whose division directions are different with respect to each microlens, brings the performances of the phase difference detection performed for respective division directions closer.

According to the present invention, provided is an image sensor comprising a plurality of pixels arranged in a matrix, from which signals of the pixels are read out in units of rows, wherein the plurality of pixels comprise: a plurality of microlenses; or each of the plurality of microlenses, a pair of first semiconductor regions formed at a first depth from a surface on which light is incident; a pair of second semiconductor regions formed at a second depth deeper than the first depth; and a plurality of connecting regions that connect the pair of first semiconductor regions and the pair of second semiconductor regions, respectively, wherein, in pixels having a first arrangement among the plurality of pixels, a direction of arranging the pair of first semiconductor regions and the pair of second semiconductor regions is a first direction which is a row direction, wherein, in pixels having a second arrangement among the plurality of pixels, a direction of arranging the pair of first semiconductor regions is a second direction which is orthogonal to the first direction and a direction of arranging the pair of second semiconductor regions is the first direction, and a crosstalk ratio between the first semiconductor regions of the pixels having the second arrangement is made smaller than a crosstalk ratio between the first semiconductor regions of the pixels having the first arrangement.

Further, according to the present invention, provided is an image sensor comprising a plurality of pixels arranged in a matrix, from which signals of the pixels are read out in units of rows, wherein the plurality of pixels comprise: a plurality of microlenses; for each of the plurality of microlenses, a pair of first semiconductor regions formed at a first depth from a surface on which light is incident; a pair of second semiconductor regions formed at a second depth deeper than the first depth; and a plurality of connecting regions that connect the pair of first semiconductor regions and the pair of second semiconductor regions, respectively, wherein, in pixels having a third arrangement among the plurality of pixels, a direction of arranging the pair of first semiconductor regions and the pair of second semiconductor regions is a first direction which is orthogonal to a row direction, wherein, in pixels having a fourth arrangement among the plurality of pixels, a direction of arranging the pair of first semiconductor regions is a second direction which is orthogonal to the first direction and a direction of arranging the pair of second semiconductor regions is the first direction.

Furthermore, according to the present invention, provided is an image capturing apparatus comprising: an image sensor comprising a plurality of pixels arranged in a matrix, from which signals of the pixels are read out in units of rows, wherein the plurality of pixels comprise: a plurality of microlenses; for each of the plurality of microlenses, a pair of first semiconductor regions formed at a first depth from a surface on which light is incident; a pair of second semiconductor regions formed at a second depth deeper than the first depth; and a plurality of connecting regions that connect the pair of first semiconductor regions and the pair of second semiconductor regions, respectively; and one or more processors and/or circuitry which functions as a processor that processes the signals output from the image sensor, wherein, in pixels having a first arrangement among the plurality of pixels, a direction of arranging the pair of first semiconductor regions and the pair of second semiconductor regions is a first direction which is a row direction, wherein, in pixels having a second arrangement among the plurality of pixels, a direction of arranging the pair of first semiconductor regions is a second direction which is orthogonal to the first direction and a direction of arranging the pair of second semiconductor regions is the first direction, and a crosstalk ratio between the first semiconductor regions of the pixels having the second arrangement is made smaller than a crosstalk ratio between the first semiconductor regions of the pixels having the first arrangement.

Further, according to the present invention, provided is an image capturing apparatus comprising: an image sensor comprising a plurality of pixels arranged in a matrix, from which signals of the pixels are read out in units of rows, wherein the plurality of pixels comprise: a plurality of microlenses; for each of the plurality of microlenses, a pair of first semiconductor regions formed at a first depth from a surface on which light is incident; a pair of second semiconductor regions formed at a second depth deeper than the first depth; and a plurality of connecting regions that connect the pair of first semiconductor regions and the pair of second semiconductor regions, respectively; and one or more processors and/or circuitry which functions as a processor that processes the signals output from the image sensor, wherein, in pixels having a third arrangement among the plurality of pixels, a direction of arranging the pair of first semiconductor regions and the pair of second semiconductor regions is a first direction which is orthogonal to a row direction, wherein, in pixels having a fourth arrangement among the plurality of pixels, a direction of arranging the pair of first semiconductor regions is a second direction which is orthogonal to the first direction and a direction of arranging the pair of second semiconductor regions is the first direction.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 3 is an equivalent circuit diagram of a pixel according to the first embodiment.

4

Figures 4A, 4B:
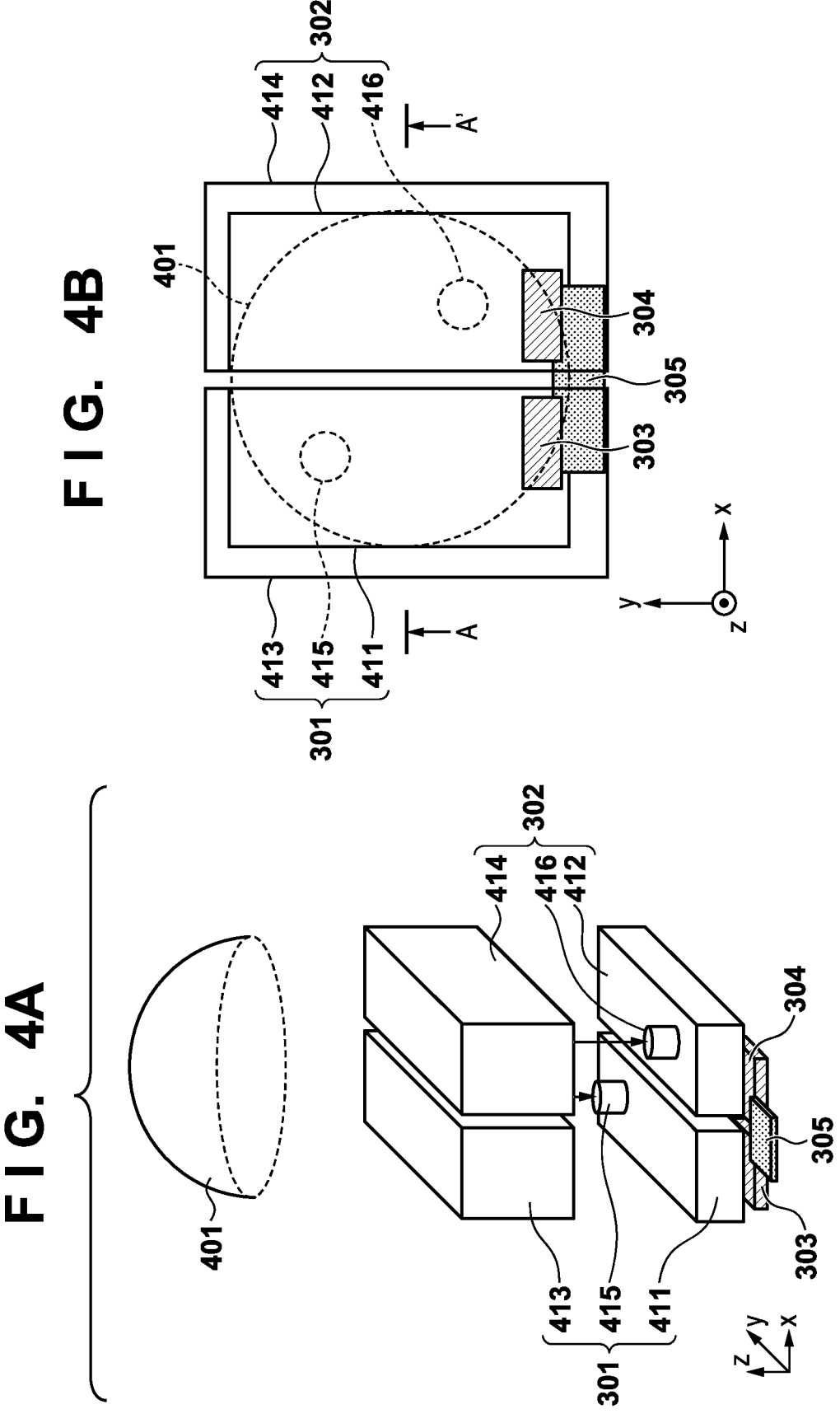

FIGS. 4A and 4B are schematic diagram illustrating a configuration of a pixel having a first arrangement according to the first embodiment.

FIGS. 5A and 5B are schematic diagrams illustrating a configuration of a pixel having a second arrangement according to the first embodiment.

FIG. 6 is a diagram showing a relationship between a pixel having the first arrangement and a partial pupil region according to the first embodiment.

FIG. 7 is a conceptual diagram showing an example of a pupil intensity distribution in partial pupil regions corresponding to a pixel having the first arrangement according to the first embodiment.

FIG. 8 is a diagram illustrating a sensor entrance pupil of an image sensor according to the first embodiment.

Figure 9:
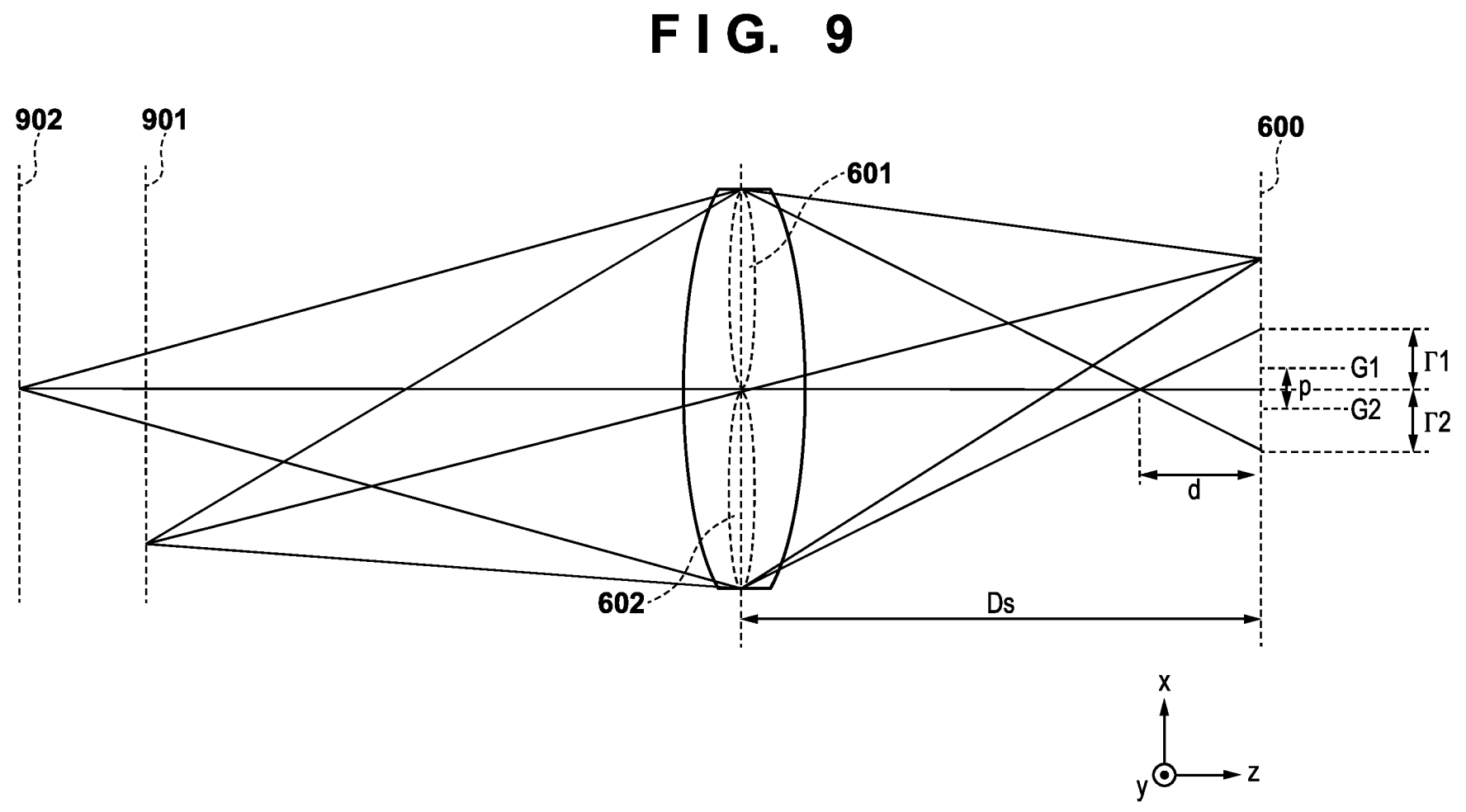

FIG. 9 is a diagram illustrating a schematic relationship between an image shift amount between parallax images and a defocus amount according to the first embodiment.

FIG. 10 is a diagram showing a relationship between a pixel having the second arrangement and partial pupil regions according to the first embodiment.

FIG. 11 is a conceptual diagram showing an example of a pupil intensity distribution in partial pupil regions corresponding to a pixel having the second arrangement according to the first embodiment.

Figures 12A, 12B:
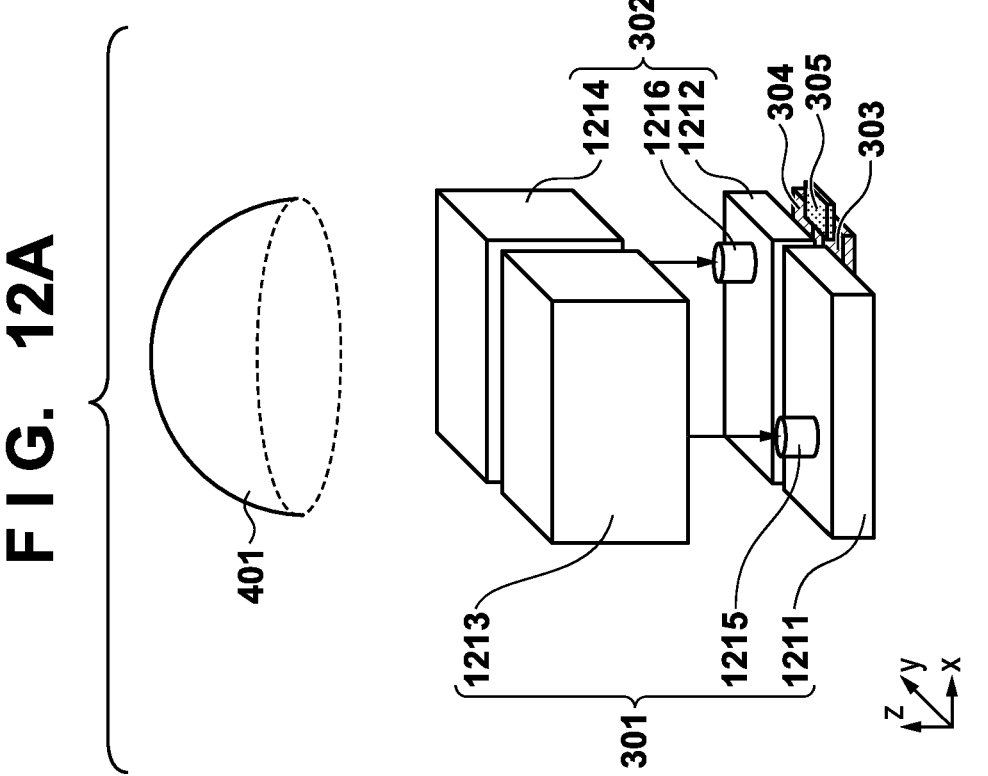

FIGS. 12A and 12B are schematic diagrams illustrating a configuration of a pixel having a third arrangement according to a second embodiment.

Figures 13A, 13B:
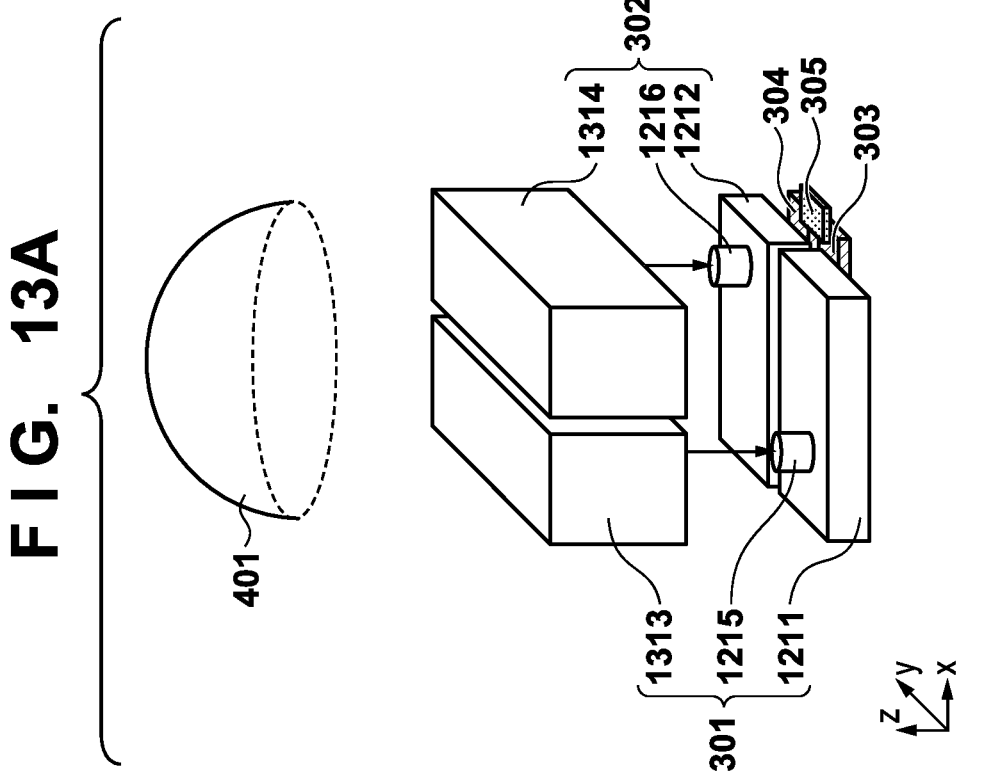

FIGS. 13A and 13B are schematic diagrams illustrating a configuration of a pixel having a fourth arrangement according to the second embodiment.

FIG. 14 is a diagram showing a relationship between a pixel having the third arrangement and partial pupil regions according to the second embodiment.

FIG. 15 is a conceptual diagram showing an example of a pupil intensity distribution in partial pupil regions corresponding to a pixel having the third arrangement according to the second embodiment.

FIG. 16 is a diagram showing a relationship between a pixel having the fourth arrangement and partial pupil regions according to the second embodiment.

FIG. 17 is a conceptual diagram showing an example of a pupil intensity distribution in partial pupil regions corresponding to a pixel having the fourth arrangement according to the second embodiment.

DESCRIPTION OF THE EMBODIMENTS

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

[Overall Configuration]

Figure 1:
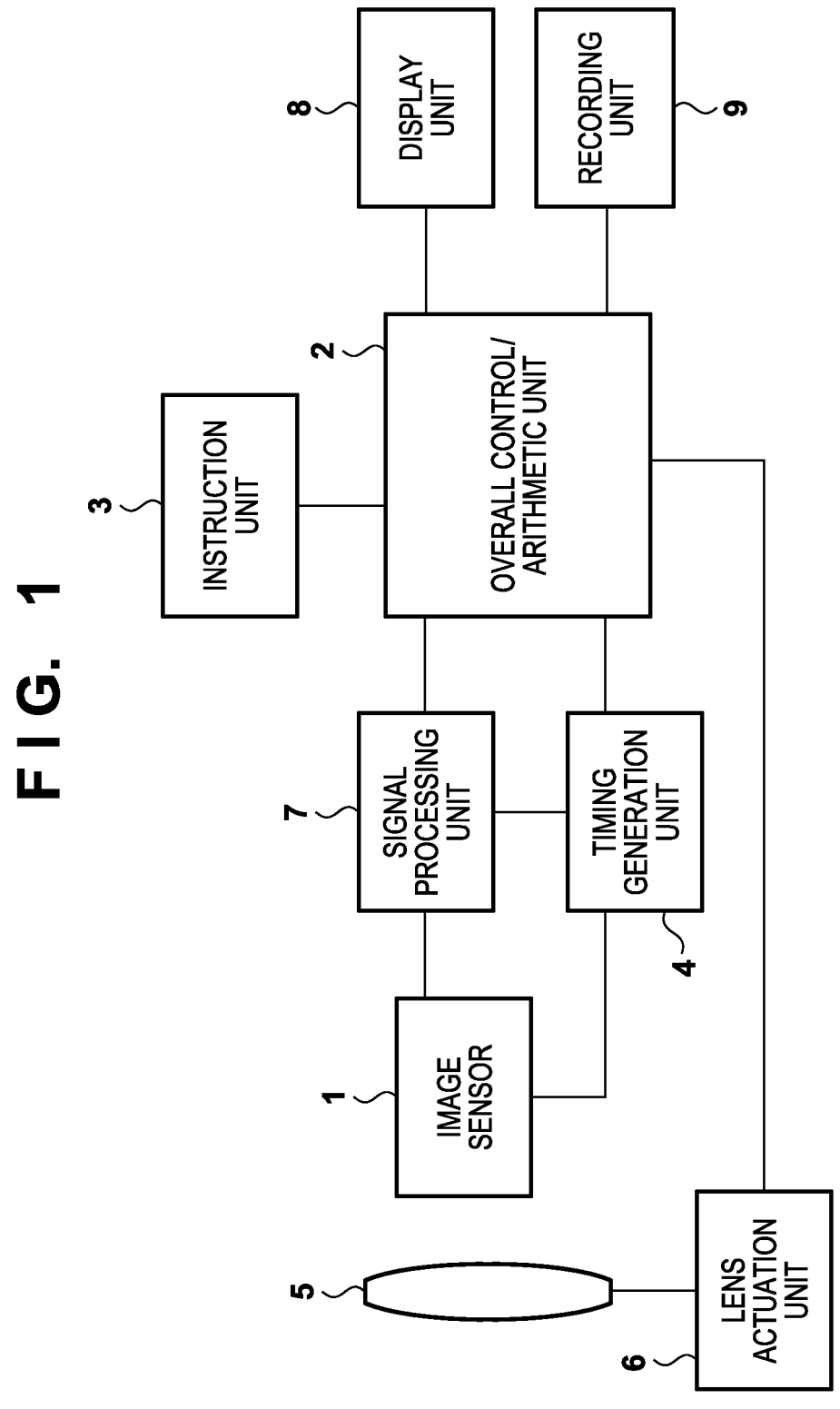
FIG. 1 is a block diagram illustrating a schematic configuration of an image capturing apparatus according to a first embodiment.

FIG. 1 is a block diagram showing a schematic configuration of an image capturing apparatus according to a first embodiment of the present invention. The image capturing apparatus of the present embodiment includes an image sensor 1, an overall control/arithmetic unit 2, an instruction unit 3, a timing generation unit 4, an imaging lens unit 5, a lens actuation unit 6, a signal processing unit 7, a display unit 8 and a recording unit 9.

The imaging lens unit 5 forms an optical image of a subject on the image sensor 1. Although it is represented by one lens in the figure, the imaging lens unit 5 may include a plurality of lenses including a focus lens, a zoom lens, and so on, and a diaphragm, and may be detachable from the main body of the image capturing apparatus or may be integrally configured with the main body.

The image sensor 1 converts the light incident through the imaging lens unit 5 into electric signals and outputs them. Signals are read out from each pixel of the image sensor 1 so that pupil division signals (referred to as "phase difference signals", hereinafter) that can be used in phase difference focus detection and an imaging signal that is a signal of each pixel can be acquired.

The signal processing unit 7 performs predetermined signal processing such as correction processing on the signals output from the image sensor 1, and outputs the phase difference signals used for focus detection and the imaging signal used for recording.

The overall control/arithmetic unit 2 comprehensively actuates and controls the entire image capturing apparatus. In addition, the overall control/arithmetic unit 2 also performs calculations for focus detection using the phase difference signals processed by signal processing unit 7, and performs arithmetic processing for exposure control, and predetermined signal processing, such as development for generating images for recording/playback and compression, on the image signal.

The lens actuation unit 6 actuates the imaging lens unit 5, and performs focus control, zoom control, aperture control, and the like on the imaging lens unit 5 according to control signals from the overall control/arithmetic unit 2.

The instruction unit 3 receives inputs such as shooting execution instructions, actuation mode settings for the image capturing apparatus, and other various settings and selections that are input from the outside by the operation of the user, for example, and sends them to the overall control/arithmetic unit 2.

The timing generation unit 4 generates a timing signal for actuating the image sensor 1 and the signal processing unit 7 according to a control signal from the overall control/arithmetic unit 2.

The display unit 8 displays a preview image, a playback image, and information such as the actuation mode settings of the image capturing apparatus.

The recording unit 9 is provided with a recording medium (not shown), and records an imaging signal for recording. Examples of the recording medium include semiconductor memories such as flash memory. The recording medium may be detachable from the recording unit 9 or may be built-in.

[Image Sensor]

Figure 2:
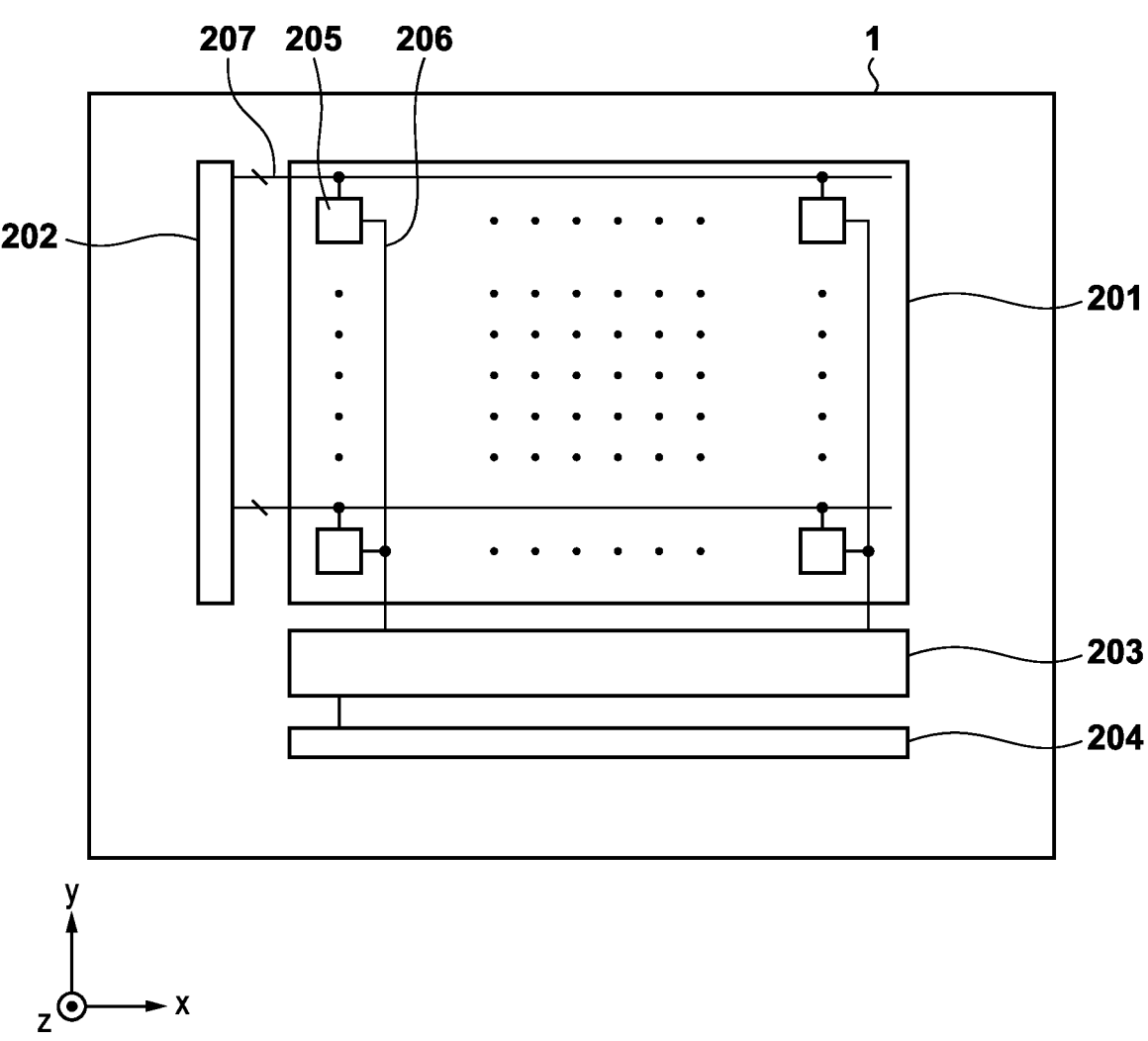
FIG. 2 is a diagram schematically illustrating an example of an overall configuration of an image sensor according to the first embodiment.

FIG. 2 is a diagram schematically showing an example of the overall configuration of an image sensor 1 shown in FIG. 1. The image sensor 1 includes a pixel array 201, a vertical selection circuit 202, a column circuit 203, and a horizontal selection circuit 204.

A plurality of pixels 205 are arranged in a matrix in the pixel array 201. The outputs of the vertical selection circuit 202 are input to the pixels 205 via pixel actuation wiring groups 207, and the pixel signals of the pixels 205 in a row selected by the vertical selection circuit 202 are read out to the column circuit 203 via output signal lines 206. One output signal line 206 may be provided for each pixel column or for a plurality of pixel columns, or a plurality of the output signal lines 206 may be provided for each pixel column. Signals read out in parallel through the plurality of output signal lines 206 are input to the column circuit 203, and the column circuit 203 performs processes, such as signal amplification, noise reduction, and A/D conversion, and holds the processed signals. The horizontal selection circuit 204 selects the signals held in the column circuit 203 sequentially, randomly, or simultaneously, so that the selected signals are output outside the image sensor 1 via a horizontal output line and an output section (not shown).

By sequentially performing the operation of outputting the pixel signals in the row selected by the vertical selection circuit 202 to the outside of the image sensor 1 while the vertical selection circuit 202 changes the row to select, a two-dimensional imaging signal or phase difference signals can be read out from the image sensor 1.

[Pixel Circuit/Signal Readout]

FIG. 3 is an equivalent circuit diagram of the pixel 205 of the present embodiment.

Each pixel 205 has two photodiodes 301 (PDA) and 302 (PDB), which are photoelectric conversion portions. The signal charge which is photoelectrically converted by the PDA 301 corresponding to the amount of incident light and accumulated in the PDA 301 is transferred to a floating diffusion unit (FD) 305 that constitutes a charge storage unit via a transfer switch (TXA) 303. Further, the signal charge which is photoelectrically converted by the PDB 302 and accumulated in the PDB 302 is transferred to the FD 305 via a transfer switch (TXB) 304. A reset switch (RES) 306 is turned on to reset the FD 305 to the voltage of a constant voltage source VDD. Further, by turning on the RES 306, TXA 303 and TXB 304 simultaneously, it is possible to reset the PDA 301 and PDB 302.

When a selection switch (SEL) 307 for selecting a pixel is turned on, the amplification transistor (SF) 308 converts the signal charge accumulated in the FD 305 into a voltage, and the converted signal voltage is output from the pixel 205 to the output signal line 206. Further, the gates of the TXA 303, TXB 304, RES 306, and SEL 307 are connected to the pixel actuation wiring group 207, and are controlled by the vertical selection circuit 202.

In the following description, in the present embodiment, the signal charge accumulated in the photoelectric conversion portion is electrons, the photoelectric conversion portion is formed by an N-type semiconductor, and a P-type semiconductor is used to separate the N-type semiconductor. However, the signal charge may be holes, and the photoelectric conversion portion may be formed by a P-type semiconductor and an N-type semiconductor may be used to separate the P-type semiconductor.

Next, in the pixel having the above-described configuration, the operation of reading out the signal charge from the PDAs 301 and PDBs 302 after the predetermined charge accumulation period has elapsed since the PDAs 301 and PDBs 302 are reset will be described. First, when the SEL 307 of each of the pixels 205 in the row selected by the vertical selection circuit 202 is turned on and the source of the SF 308 and the output signal line 206 are connected, a voltage corresponding to the voltage of the FD 305 can be read out to the output signal line 206. Then, the RES 306 is turned on and then off, thereby the potential of the FD 305 is reset. After that, the process waits until the output signal line 206 affected by the voltage fluctuation of the FD 305 settles down, and the column circuit 203 takes the voltage of the settled output signal line 206 as a signal voltage N, processes it, and holds the processed signal voltage N.

After that, the TXA 303 is turned on and then off, thereby the signal charge stored in the PDA 301 is transferred to the FD 305. The voltage of the FD 305 drops by the amount corresponding to the amount of signal charge stored in the PDA 301. After that, the process waits until the output signal line 206 affected by the voltage fluctuation of the FD 305 settles down, and the column circuit 203 takes the voltage of the settled output signal lines 206 as a signal voltage A, processes it, and holds the processed signal voltage A.

After that, the TXB 304 is turned on and then off, thereby the signal charge stored in the PDB 302 is transferred to the FD 305. The voltage of the FD 305 drops by the amount corresponding to the amount of signal charge stored in the PDB 302. After that, the process waits until the output signal line 206 affected by the voltage fluctuation of the FD 305 settles down, and the column circuit 203 takes the voltage of the settled output signal lines 206 as a signal voltage (A+B), processes it, and holds the processed signal voltage (A+B).

From the difference between the signal voltage N and the signal voltage A taken in this way, a signal A corresponding to the amount of signal charge stored in the PDA 301 can be obtained. Further, from the difference between the signal voltage A and the signal voltage (A+B), a signal B corresponding to the amount of signal charge accumulated in the PDB 302 can be obtained. This difference calculation may be performed by the column circuit 203 or after these signals are output from the image sensor 1. Phase difference signals can be obtained by using the signal A and the signal B, independently, and an imaging signal can be obtained by adding the signal A and the signal B. Alternatively, in a case where the difference calculation is performed after the signal voltages are output from the image sensor 1, the imaging signal may be obtained by taking the difference between the signal voltage N and the signal voltage (A+B).

[Structure of Photoelectric Conversion Portions]
Structure of a Pixel for Phase Difference Detection in the Horizontal Direction FIGS. 4A and 4B are schematic diagrams showing a first arrangement of the semiconductor regions that constitute the pixel 205 according to the present embodiment. FIG. 4A is a schematic perspective diagram, and FIG. 4B is a schematic plan view diagram showing the positional relationship in the plan view. Note that "plan view" means viewing a pixel 205 from the z direction or the −z direction with respect to a plane (xy plane) substantially parallel to the surface of the semiconductor substrate on the side where the gates of the transistors are arranged. Further, in the present embodiment, the "horizontal" direction refers to the x direction, the "vertical" direction refers to the y direction, and the "depth" direction refers to the z direction.

As shown in FIG. 4A, the pixel 205 having the first arrangement includes a microlens (ML) 401, accumulation regions 411, 412, sensitivity regions 413, 414, connection regions 415, 416, TXA 303, TXB 304, and FD 305. The sensitivity regions 413 and 414 are formed at a first depth from the surface on which light is incident, and the accumulation regions 411 and 412 are formed at a second depth that is deeper than the first depth. Further, for the sake of clarity, the region where the electric charge is mainly generated in response to the incident light is referred to as the "sensitivity region", and the region where the generated electric charge is mainly accumulated is referred to as the "accumulation region". However, there is no clear distinction between the charge generation region and the charge accumulation region. Charges are also generated in the accumulation regions 411 and 412 in response to the light that has arrived, and a part of the generated charges stays in the sensitivity regions 413 and 414 as well. Note that color filters (not shown) are arranged between the ML 401 and the sensitivity regions 413 and 414.

In the first arrangement, the PDA 301 includes the accumulation region 411, sensitivity region 413 and connection region 415, and the PDB 302 includes the accumulation region 412, sensitivity region 414 and connection region 416. Further, in the first arrangement, all of the accumulation regions 411 and 412 and the sensitivity regions 413 and 414 extend in the y direction, that is, in the same direction. That is, both the division direction of the sensitivity regions and the division direction of the accumulation regions in the first arrangement are the x direction. Since the division direction of the sensitivity regions is the x direction, phase difference AF can be performed using phase difference signals obtained at the same timing from the same row selected by the vertical selection circuit 202.

Most of the light incident through the ML 401 is photoelectrically converted in the sensitivity regions 413 and 414. Charges generated in the sensitivity region 413 move through the connection region 415 to the accumulation region 411 and are accumulated there. Also, charges generated in the sensitivity region 414 move through the connection region 416 to the accumulation region 412 and are accumulated there. Here, a potential gradient is formed within the sensitivity regions 413, 414 such that the potential to be exerted on electrons in the depth direction decreases so that charges move from the sensitivity regions 413, 414 to the accumulation regions 411, 412. Further, in a region between the sensitivity region 413 and the sensitivity region 414, a p-type impurity concentration is made higher than that in the sensitivity regions so as to form a potential barrier. In the following description, regions between the sensitivity regions and regions between the accumulation regions are called dividing regions.

Charge Crosstalk Rate Distribution

Most of the charge generated in the sensitivity region 413 is accumulated in the accumulation region 411 via the connection region 415 as described above, but some of the charge generated in the sensitivity region 413 may move to the sensitivity region 414 and accumulated in the accumulation region 412 via the connection region 416. Such a phenomenon in which charge moves from the PDA 301 to the PDB 302 or from the PDB 302 to the PDA 301 is called "charge crosstalk". The rate at which the charge crosstalk occurs (hereinafter referred to as the "charge crosstalk rate") is higher in an area closer to the dividing region between the sensitivity regions in plan view. That is, in plan view, the charge crosstalk rate of charges generated in the central part of the sensitivity region 413 is smaller than the charge crosstalk rate of charges generated in a part of the sensitivity region 413 close to the sensitivity region 414. In addition, the shorter the moving path to the accumulation region is, the smaller the charge crosstalk rate becomes. That is, in the sensitivity region, the charge crosstalk rate is smaller at locations closer to the accumulation region than at locations closer to the ML 401 for the same x and y coordinates. In the following description, the distribution of crosstalk rates within the sensitivity region will be referred to as "charge crosstalk rate distribution".

The charge crosstalk rate distribution decreases as the potential barrier between the sensitivity regions 413 and 414 increases, and as the potential gradient in the depth direction within the sensitivity region increases. In this embodiment, since the sensitivity region and the accumulation region are formed separately in the depth direction, the charge crosstalk rate distribution can be adjusted by altering the sensitivity regions and the structure between the sensitivity regions without changing the structure between the accumulation regions, which is one of the factors that determine the moving characteristics of supersaturated charges.

In addition, charge crosstalk can also occur between adjacent pixels. Charge crosstalk that occurs between adjacent pixels is a factor that causes resolution deterioration, or the like, in an imaging signal. Therefore, it is desirable that the charge crosstalk rate between adjacent pixels be lower than the charge crosstalk rate from the PDA 301 to the PDB 302 or from the PDB 302 to the PDA 301. Specifically, for example, the charge crosstalk rate can be suppressed by separating adjacent pixels with an insulator or by increasing the height of a potential barrier.

Structure of a Pixel for Phase Difference Detection in the Vertical Direction

FIGS. 5A and 5B are schematic diagrams showing a second arrangement of the semiconductor regions that constitute the pixel 205 according to the present embodiment. FIG. 5A is a schematic perspective diagram, and FIG. 5B is a schematic plan view diagram showing the positional relationship in the plan view. Note that the definitions of "plan view" and x, y, and z are the same as that of those in FIGS. 4A and 4B, so the description thereof will be omitted.

As shown in FIG. 5A, the pixel 205 having the second arrangement includes the ML 401, accumulation regions 411, 412 formed at a second depth, sensitivity regions 513, 514 formed at a first depth, connection regions 415, 416, TXA 303, TXB 304, and FD 305. In the second arrangement, the PDA 301 includes the accumulation region 411, sensitivity region 513, and connection region 415, and the PDB 302 includes the accumulation region 412, sensitivity region 514, and connection region 416. Further, in the second arrangement, the accumulation regions 411, 412 extend in the y direction and the sensitivity regions 513, 514 extend in the x direction, namely the accumulation regions 411, 412 and the sensitivity regions 513, 514 extend in the orthogonal directions in plan view, i.e., in different directions. Further, in the second arrangement, the division direction of the sensitivity regions is the y direction, and the division direction of the accumulation regions is the x direction. Note that color filters (not shown) are arranged between the ML 401 and the sensitivity regions 513 and 514.

The potential gradient of the sensitivity regions 513, 514 in the depth direction in the second arrangement is formed to be steeper than the potential gradient of the sensitivity regions 413, 414 in the depth direction in the first arrangement. In addition, a p-type impurity concentration in a region between the sensitivity regions 513 and 514 is made higher than that in the region between the sensitivity regions 413 and 414 so that the potential barrier between the sensitivity regions 513 and 514 is higher than the potential barrier between the sensitivity regions 413 and 414. By forming the pixel 205 in this way, the charge crosstalk rate distribution between the sensitivity regions 513 and 514 is smaller than the charge crosstalk rate distribution between the sensitivity regions 413 and 414.

Phase Difference Detection Method in the Horizontal Direction

Next, an arithmetic method for calculating a defocus amount from the phase difference signals in the overall control/arithmetic unit 2 will be described.

First, the phase difference focus detection in the x direction in the present embodiment will be described with reference to FIGS. 6 to 9. In the phase difference focus detection in the x direction in this embodiment, the image shift amount in the x direction is calculated from the phase difference signals of the pixels 205 having the first arrangement, and is converted into a defocus amount using a conversion coefficient.

FIG. 6 is a cross-sectional view of the pixel 205 having the first arrangement taken along the line A-A' shown in FIG. 4B and a pupil plane at the position separated from an imaging plane 600 of the image sensor 1 by a distance Ds in the negative direction of the z-axis. In FIG. 6, x, y, and z indicate the coordinate axes on the imaging plane 600, and $x_p$, $y_p$, and $z_p$ indicate the coordinate axes on the pupil plane.

The pupil plane and the light receiving surface of the image sensor 1 have substantially conjugated relationship via the ML 401. Therefore, the luminous flux that has passed through a partial pupil region 601 is received in the sensitivity region 413 and the accumulation region 411. Further, the luminous flux that has passed through a partial pupil region 602 is received in the sensitivity region 414 and the accumulation region 412. Therefore, the pupil division direction in a case where the pupil plane is divided in the x direction is the x direction. Therefore, the x direction dependencies of the pupil intensity distributions have shapes as illustrated in FIG. 7.

In FIG. 7, 701 indicates a first pupil intensity distribution corresponding to the sensitivity region 413 and the accumulation region 411, and 702 indicates a second pupil intensity distribution corresponding to the sensitivity region 414 and the accumulation region 412. Since the signal charges generated in the sensitivity region 413 and the accumulation region 411 are accumulated in the accumulation region 411, the signal read out from the pixel is a combined signal as shown in the first pupil intensity distribution 701. If considered for each region, a pupil intensity distribution 703 corresponds to the sensitivity region 413 and a pupil intensity distribution 705 corresponds to the accumulation region 411. Similarly, a pupil intensity distribution 704 corresponds to the sensitivity region 414 and a pupil intensity distribution 706 corresponds to the accumulation region 412.

Next, with reference to FIG. 8, a sensor entrance pupil of the image sensor 1 will be described. In the image sensor 1 of the present embodiment, the MLs 401 of respective pixels 205 are continuously shifted toward the center of the image sensor 1 depending on the image height coordinates of the pixels on the two-dimensional plane. That is, each ML 301 is arranged so as to be more eccentric toward the center as the image height of the pixel 205 becomes higher. The center of the image sensor 1 and the optical axis of the imaging optical system are shifted by the mechanism that reduces the influence of blurring due to camera shake or the like by moving the imaging optical system or the image sensor 1, but they are substantially the same. As a result, in the pupil plane located at a distance Ds from the image sensor 1, the first pupil intensity distribution 701 and the second pupil intensity distribution 702 of each pixel 205 arranged at each image height coordinate of the image sensor 1 substantially match. That is, in the pupil plane located at the distance Ds from the image sensor 1, the first pupil intensity distribution 701 and the second pupil intensity distribution 702 of all the pixels of the image sensor 1 substantially match.

Hereinafter, the first pupil intensity distribution 701 and the second pupil intensity distribution 702 are called the "sensor entrance pupil" of the image sensor 1, and the distance Ds is called the "sensor pupil distance" of the image sensor 1. It should be noted that it is not necessary to configure all pixels to have a single entrance pupil distance. For example, the pixels located at up to 80% of image height may have substantially the same entrance pupil distance, or the pixels in different rows or in different detection areas may be configured to have different entrance pupil distances.

FIG. 9 shows a schematic relationship diagram between an image shift amount and a defocus amount between parallax images. The image sensor 1 (not shown in FIG. 9) of the present embodiment is aligned on the imaging plane 600, and the exit pupil of the imaging optical system is divided into the partial pupil region 601 and the partial pupil region 602 as in FIG. 6.

For a defocus amount d, the magnitude of the distance from the imaging position of the subject to the imaging plane is given by |d|, the front focused state in which the imaging position of the subject is closer to the subject than the imaging plane is expressed by negative (d<0), and the rear focused state in which the imaging position of the subject is on the opposite side of the subject with respect to the imaging plane is expressed by positive (d>0). The in-focus state in which the imaging position of the subject is on the imaging plane is expressed as d=0. FIG. 9 shows an example in which a subject on an object plane 901 is in the in-focus state (d=0) and a subject on an object plane 902 is in the front focused state (d<0). The front focused state (d<0) and the rear focused state (d>0) are both referred to as a defocus state (|d|>0).

In the front focused state (d<0), among the luminous fluxes from the subject on the object plane 902, the luminous flux that has passed through the partial pupil region 601 (602) converges once and then diverges to have the radius Γ1 (Γ2) about the position G1 (G2) as the center of gravity of the luminous flux, and formed as a blurred image on the imaging plane 600. The blurred image is received by the sensitivity region 413 and the accumulation region 411, and the sensitivity region 414 and the accumulation region 412, and parallax images are generated. Therefore, the generated parallax images are of a blurred image of the subject with the image of the subject on the object plane 902 being spread to have the radius Γ1 (Γ2) about the position G1 (G2) of the center of gravity.

The radius Γ1 (Γ2) of blur of the subject image generally increases proportionally as the magnitude d of the defocus amount d increases. Similarly, the magnitude p of an image shift amount p (=G2–G1) between the subject images of the parallax images also increases approximately proportionally as the magnitude d of the defocus amount d increases. The same relationship holds in the rear focused state (d>0), although the image shift direction of the subject images between the parallax images is opposite to that in the front focused state. In the in-focus state (d=0), the positions of the centers of gravity of the subject images in the parallax images are the same (p=0), and no image shift occurs.

Therefore, with regard to the two phase difference signals obtained by using the signals each from the sensitivity region 413 and accumulation region 411, and the signals each from the sensitivity region 414 and accumulation region 412, as the magnitude of the defocus amount of the parallax images increases, the magnitude of the image shift amount between the two phase difference signals in the x direction increases. Based on this relationship, the phase difference focus detection is performed by converting the image shift amount calculated by performing correlation operation on the image shift amount between the parallax images in the x-direction into the defocus amount. A coefficient used at the time of converting an image shift amount to a defocus amount is called a conversion coefficient. If the conversion coefficient is large, a large defocus amount is calculated from a small image shift amount compared to a case where the conversion coefficient is small, so the focus detection is susceptible to noise on the phase difference signals, and the phase difference detection performance may decrease.

Phase Difference Detection Method in the Vertical Direction

Next, the phase difference focus detection in a case where the pupil division direction is in the y direction will be described with reference to FIGS. 10 and 11. Part of description which is similar to the phase difference focus detection in a case where the pupil division direction is in the x direction will be omitted, and different part will be described below. In the phase difference focus detection in the y direction, the image shift amount in the y direction is calculated from the phase difference signals of the pixels 205 having the second arrangement whose pupil division direction is the y direction, and is converted to a defocus amount using a conversion coefficient Ky.

FIG. 10 is a cross-sectional view of the pixel 205 having the second arrangement taken along the line B-B' shown in FIGS. 5B, and a pupil plane at a position separated from a pupil plane at the position separated from an imaging plane 600 of the image sensor 1 by a distance Ds in the negative direction of the z-axis.

The pupil plane and the light receiving surface of the image sensor 1 have substantially conjugated relationship via the ML 401. Therefore, light received by the sensitivity region 513 is the luminous flux that has passed through a partial pupil region 1001, and light received by the sensitivity region 514 is the luminous flux that has passed through a partial pupil region 1002. Further, light received by the accumulation region 411 is the luminous flux that has passed through a partial pupil region 1003, and light received by the accumulation region 412 is the luminous flux that has passed through a partial pupil region 1004. The proportion of the luminous flux received in the sensitivity regions 513 and 514 and the proportion of the luminous flux received in the accumulation regions 411 and 412 are determined mostly by the wavelength of the received light, however, most of the luminous flux is received in the sensitivity regions 513 and 514. Therefore, the pupil division direction is basically the y direction, and the y direction dependencies of the pupil intensity distributions have shapes as illustrated by solid lines in FIG. 11.

Since the charge crosstalk rate distribution of the sensitivity regions 513 and 514 is smaller than the charge crosstalk rate distribution of the sensitivity regions 413 and 414, the corresponding pupil intensity distributions 1103 and 1104 have steeper slopes at a portion (signal crossing point) where the signal intensities match comparing to the pupil intensity distributions 703 and 704. Also, since the accumulation regions 411 and 412 are not divided in the y direction, the corresponding pupil intensity distributions have shapes shown by dotted lines 1105 and 1106, respectively. As the signal charge generated in the sensitivity region 513 and the accumulation region 411 are accumulated in the accumulation region 411, the signal read out from the pixel is the combined signal of the pupil intensity distributions 1103 and 1105, as shown in the first pupil intensity distribution 1101. Similarly, the signal charge generated in sensitivity region 514 and the accumulation region 412 has the second pupil intensity distribution 1102. In this way, by making the charge crosstalk rate distribution between the sensitivity regions 513 and 514 smaller than the charge crosstalk rate distribution between the sensitivity regions 413 and 414, it is possible to make the inclinations near the signal crossing points of the phase difference signals read out from the pixels, having accumulation regions that are not divided in the pupil division direction, substantially equal.

As for the method of calculating the defocus amount from the phase difference signals, although the direction of image shift amount to be calculated changes from the x direction to the y direction, the calculation procedure is the same as the defocus amount calculation in the x direction. At this time, since the inclinations near the signal crossing point of the first pupil intensity distribution 1101 and the second pupil intensity distribution 1102 are approximately the same, the defocus amount can be calculated from the image shift amount using approximately the same conversion coefficient. That is, phase difference detection can be performed at substantially the same accuracy.

As described above, according to the first embodiment, the potential barrier of the separation region between the sensitivity regions of the pixels having the accumulation regions whose division direction is different from the division direction of the sensitivity regions is made higher than the potential barrier of the separation region between the sensitivity regions of the pixels having the accumulation regions whose division direction is the same as the division direction of the sensitivity regions. As a result, even if the division directions of the sensitivity regions and the accumulation regions are different, it is possible to obtain substantially the same phase difference detection performance as in the case where the division directions of the sensitivity regions and the accumulation regions are the same.

Second Embodiment

Next, a second embodiment of the present invention will be described. Note that the configuration of the image capturing apparatus according to the second embodiment is the same as that described with reference to FIGS. 1 to 3, so the description thereof will be omitted. As described with reference to FIG. 2, signals are read out from the pixels 205 in units of rows at different timings when selected by the vertical selection circuit 202. Therefore, the phase difference signals obtained from pixels 205 having the first arrangement are read out at the same timing, whereas the phase difference signals obtained from pixels 205 having the second arrangement are read out at different timings from row to row, so the simultaneity of the latter phase difference signals is low. Accordingly, in the second embodiment, charge crosstalk is used to bring the quality of the phase difference signals separated in the y direction closer to the quality of the phase difference signals separated in the x direction. A configuration of a pixel and a phase difference detection method according to the second embodiment will be described below.

[Structure of Photoelectric Conversion Portions]

Structure of a Pixel for Phase Difference Detection in the Vertical Direction

FIGS. 12A and 12B are schematic diagrams showing a third arrangement of the semiconductor regions that constitute the pixel 205 according to the second embodiment. FIG. 12A is a schematic perspective diagram, and FIG. 12B is a schematic plan view diagram showing the positional relationship in plan view. Note that the definitions of "plan view" and x, y, and z are the same as those in FIGS. 4A and 4B, so the description thereof will be omitted.

As shown in FIG. 12A, the pixel 205 having the third arrangement includes the ML 401, accumulation regions 1211, 1212 formed at a second depth, sensitivity regions 1213, 1214 formed at a first depth, connection regions 1215, 1216, TXA 303, TXB 304, and FD 305. In the third arrangement, the PDA 301 includes the accumulation region 1211, sensitivity region 1213 and connection region 1215, and the PDB 302 includes the accumulation region 1212, sensitivity region 1214, and connection region 1216. Further, the TXA 303, TXB 304 and FD 305 are arranged by the side of the PDA 301 and PDB 302 in the horizontal direction. Therefore, in the third arrangement, all of the accumulation regions 1211 and 1212 and the sensitivity regions 1213 and 1214 extend in the x direction, that is, in the same direction. In addition, both the division direction of the sensitivity regions and the division direction of the accumulation regions in the third arrangement are the y direction. In this case, since the division direction of the sensitivity regions is the y direction, phase difference AF is performed using phase difference signals obtained at the different timings from the different rows selected by the vertical selection circuit 202. Note that color filters (not shown) are arranged between the ML 401 and the sensitivity regions 1213 and 1214.

Structure of a Pixel for Phase Difference Detection in the Horizontal Direction

FIGS. 13A and 13B are schematic diagrams showing a fourth arrangement of the semiconductor regions that constitute the pixel 205 according to the present embodiment. FIG. 13A is a schematic perspective diagram, and FIG. 13B is a schematic plan view diagram showing the positional relationship in plan view. Note that the definitions of "plan view" and x, y, and z are the same as those in FIGS. 4A and 4B, so the description thereof will be omitted.

As shown in FIG. 13A, the pixel 205 having the fourth arrangement includes the ML 401, accumulation regions 1211, 1212, sensitivity regions 1313, 1314, connection regions 1215, 1216, TXA 303, TXB 304, and FD 305. In the fourth arrangement, the PDA 301 includes the accumulation region 1211, sensitivity region 1213, and connection region 1215, and the PDB 302 includes the accumulation region 1212, sensitivity region 1314, and connection region 1216. Further, in the fourth arrangement, the accumulation regions 1211, 1212 extend in the x direction and the sensitivity regions 1313, 1314 extend in the y direction. Further, in the fourth arrangement, the division direction of the sensitivity regions is the x direction, and the division direction of the accumulation regions is the y direction. In this case, since the division direction of the sensitivity region is the x direction, phase difference AF can be performed using signals obtained at the same timing from the same row selected by the vertical selection circuit 202. Therefore, the simultaneity of the phase difference signals is higher than those obtained from the pixels 205 having the third arrangement. Note that color filters (not shown) are arranged between the ML 401 and the sensitivity regions 1313 and 1314.

In the second embodiment, the potential barrier between the sensitivity regions 1213 and 1214 has substantially the similar structure as the potential barrier between the sensitivity regions 1313 and 1314. Further, the potential gradients of the sensitivity regions 1213, 1214, 1313, 1314 in the depth direction are substantially the same. Accordingly, the charge crosstalk rate distribution between the sensitivity regions 1213 and 1214 is substantially the same as the charge crosstalk rate distribution between the sensitivity regions 1313 and 1314.

Pupil Intensity Distributions in the Vertical Direction

A pupil intensity distribution of the phase difference detection method in which the pupil division direction is the y direction will be described with reference to FIGS. 14 and 15.

FIG. 14 is a cross-sectional view of the pixel 205 taken along the line C-C' shown in FIG. 12B and a pupil plane at the position separated from the imaging plane 600 of the image sensor 1 by a distance Ds in the negative direction of the z-axis. In FIG. 14, x, y, and z indicate the coordinate axes on the imaging plane 600, and $x_p$, $y_p$, and $z_p$ indicate the coordinate axes on the pupil plane.

The pupil plane and the light receiving surface of the image sensor 1 have substantially conjugated relationship via the ML 401. Therefore, the luminous flux that has passed through a partial pupil region 1401 is received in the sensitivity region 1213 and the accumulation region 1211, and the luminous flux that has passed through a partial pupil region 1402 is received in the sensitivity region 1214 and the accumulation region 1212. Therefore, the pupil division direction is the y direction, and the y direction dependencies of the pupil intensity distributions have shapes as illustrated in FIG. 15.

In FIG. 15, 1501 indicates a first pupil intensity distribution corresponding to the sensitivity region 1213 and the accumulation region 1211, and 1502 indicates a second pupil intensity distribution corresponding to the sensitivity region 1214 and the accumulation region 1212. Since the signal charges received by the sensitivity region 1213 and the accumulation region 1211 are accumulated in the accumulation region 1211, the signal read out from the pixel is a combined signal as shown in the first pupil intensity distribution 1501. If considered for each region, a pupil intensity distribution 1503 corresponds to the sensitivity region 1213 and a pupil intensity distribution 1505 corresponds to the accumulation region 1211. Similarly, a pupil intensity distribution 1504 corresponds to the sensitivity region 1214 and a pupil intensity distribution 1506 corresponds to the accumulation region 1212.

Pupil Intensity Distributions in the Horizontal Direction

Next, a pupil intensity distribution of the phase difference detection method in which the pupil division direction is the x direction will be described with reference to FIGS. 16 and 17.

FIG. 14 is a cross-sectional view of the pixel 205 taken along the line D-D' shown in FIG. 13B and a pupil plane at the position separated from the imaging plane 600 of the image sensor 1 by a distance Ds in the negative direction of the z-axis.

The pupil plane and the light receiving surface of the image sensor 1 have substantially conjugated relationship via the ML 401. Therefore, light received by the sensitivity region 1313 is the luminous flux that has passed through a partial pupil region 1601, and light received by the sensitivity region 1314 is the luminous flux that has passed through a partial pupil region 1602. Further, light received by the accumulation region 1211 is the luminous flux that has passed through a partial pupil region 1603, and light received by the accumulation region 1212 is the luminous flux that has passed through a partial pupil region 1604. The proportion of the luminous flux received in the sensitivity regions 1313 and 1314 and the proportion of the luminous flux received in the accumulation regions 1211 and 1212 are similarly to those described in the first embodiment, and most of the luminous flux is received in the sensitivity regions 1313 and 1314. Therefore, the pupil division direction is basically the x direction, and the x direction dependencies of the pupil intensity distributions have shapes as illustrated by solid lines in FIG. 17.

Since the charge crosstalk rate distribution of the sensitivity regions 1313 and 1314 is similar to the charge crosstalk rate distribution of the sensitivity regions 1213 and 1214, the corresponding pupil intensity distributions 1703 and 1704 have similar shapes as the pupil intensity distributions 1503 and 1504. Also, since the accumulation regions 1211 and 1212 are not divided in the x direction, the corresponding pupil intensity distributions have shapes shown by dotted lines 1705 and 1706, respectively. As the signal charge generated in the sensitivity region 1313 and the accumulation region 1211 are accumulated in the accumulation region 1211, the signal read out from the pixel is the combined signal of the pupil intensity distributions 1703 and 1705, as shown in the first pupil intensity distribution 1701. Similarly, the signal charge generated in sensitivity region 1314 and the accumulation region 1212 has the second pupil intensity distribution 1702. In this way, by making the charge crosstalk rate distribution between the sensitivity regions 1313 and 1314 similar to the charge crosstalk rate distribution between the sensitivity regions 1213 and 1214, it is possible to make the inclination of the phase difference signals divided in the vertical direction having accumulation regions that are not divided in the pupil division direction stepper than that of the phase difference signals divided in the horizontal direction near the signal crossing points.

As described above, the phase difference signals divided in the horizontal direction are obtained from pixel signals read out simultaneously by the vertical selection circuit 202, while the phase difference signals divided in the vertical direction are obtained from pixel signals read out at different times, so the simultaneity of the latter phase difference signals is low. Therefore, by making the inclinations at the signal crossing point of the phase difference signals divided in the vertical direction obtained from the third pixels steeper than that of the fourth pixels, the conversion coefficient for the vertical direction can be made smaller than the conversion coefficient for the horizontal direction. As a result, the noise resistance of the phase difference detection in the vertical direction is increased, and the influence of the loss of simultaneity of the phase difference signals can be reduced. Accordingly, even if the division directions of the sensitivity regions and the accumulation regions are different, it is possible to obtain substantially the same phase difference detection performance as in the case where the division directions of the sensitivity regions and the accumulation regions are the same.

As described above, according to the second embodiment, by setting the division direction of the accumulation regions to the direction of row by which the pixels 205 are selected, it is possible to achieve substantially the same phase difference detection performance in the x direction and the y direction without making different potential gradients in the sensitive regions and different potential barriers between the sensitive regions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-005822, filed Jan. 18, 2022 which is hereby incorporated by reference herein in its entirety.

What is claimed is:

1. An image sensor comprising a plurality of pixels arranged in a matrix, from which signals of the pixels are read out in units of rows, wherein the plurality of pixels comprise:
   a plurality of microlenses;
   for each of the plurality of microlenses, a pair of first semiconductor regions formed at a first depth from a surface on which light is incident;

a pair of second semiconductor regions formed at a second depth deeper than the first depth; and a plurality of connecting regions that connect the pair of first semiconductor regions and the pair of second semiconductor regions, respectively, wherein, in pixels having a first arrangement among the plurality of pixels, a direction of arranging the pair of first semiconductor regions and the pair of second semiconductor regions is a first direction which is a row direction, wherein, in pixels having a second arrangement among the plurality of pixels, a direction of arranging the pair of first semiconductor regions is a second direction which is orthogonal to the first direction and a direction of arranging the pair of second semiconductor regions is the first direction, and a crosstalk ratio between the first semiconductor regions of the pixels having the second arrangement is made smaller than a crosstalk ratio between the first semiconductor regions of the pixels having the first arrangement, and wherein, in the pair of first semiconductor regions in the second arrangement, a potential gradient is formed such that electrons or holes generated in the pair of first semiconductor regions move toward the pair of second semiconductor regions and the potential gradient is made steeper than a potential gradient in the pair of first semiconductor regions in the first arrangement.

2. The image sensor according to claim 1, wherein a potential barrier of a region separating the pair of the first semiconductor regions in the second arrangement is made higher than a potential barrier of a region separating the pair of the first semiconductor regions in the first arrangement.

3. The image sensor according to claim 1, wherein, in the pair of first semiconductor regions in the second arrangement, a potential gradient is formed in the second direction such that electrons or holes generated in the pair of first semiconductor regions move away from the region separating the pair of first semiconductor regions.

4. The image sensor according to claim 1, wherein a potential barrier of a region separating the pixels is made higher than a potential barrier of a region separating the pair of the first semiconductor regions in the second arrangement.

5. The image sensor according to claim 1, wherein the first semiconductor regions generate charge by performing photoelectric conversion on incident light, and the second semiconductor regions accumulate the charge generated in the first semiconductor regions via the connecting regions.

6. The image sensor according to claim 1, further comprising one or more processors and/or circuitry which functions as a selector that sequentially selects the plurality of pixels arranged in the matrix in the second direction in units of rows.

7. The image sensor according to claim 1, further comprising one or more processors and/or circuitry which functions as a selector that sequentially selects the plurality of pixels arranged in the matrix in the second direction in units of rows.

8. An image sensor comprising a plurality of pixels arranged in a matrix, from which signals of the pixels are read out in units of rows, wherein the plurality of pixels comprise:

a plurality of microlenses;

for each of the plurality of microlenses, a pair of first semiconductor regions formed at a first depth from a surface on which light is incident;

a pair of second semiconductor regions formed at a second depth deeper than the first depth; and a plurality of connecting regions that connect the pair of first semiconductor regions and the pair of second semiconductor regions, respectively, wherein, in pixels having a third arrangement among the plurality of pixels, a direction of arranging the pair of first semiconductor regions and the pair of second semiconductor regions is a first direction which is orthogonal to a row direction, wherein, in pixels having a fourth arrangement among the plurality of pixels, a direction of arranging the pair of first semiconductor regions is a second direction which is orthogonal to the first direction and a direction of arranging the pair of second semiconductor regions is the first direction, and wherein, in the pair of first semiconductor regions in the fourth arrangement, a potential gradient is formed such that electrons or holes generated in the pair of first semiconductor regions move toward the pair of second semiconductor regions and the potential gradient is made steeper than a potential gradient in the pair of first semiconductor regions in the third arrangement.

9. The image sensor according to claim 8, wherein the first semiconductor regions generate charge by performing photoelectric conversion on incident light, and the second semiconductor regions accumulate the charge generated in the first semiconductor regions via the connecting regions.

10. An image capturing apparatus comprising:

an image sensor comprising a plurality of pixels arranged in a matrix, from which signals of the pixels are read out in units of rows, wherein the plurality of pixels comprise:

a plurality of microlenses;

for each of the plurality of microlenses, a pair of first semiconductor regions formed at a first depth from a surface on which light is incident;

a pair of second semiconductor regions formed at a second depth deeper than the first depth; and a plurality of connecting regions that connect the pair of first semiconductor regions and the pair of second semiconductor regions, respectively; and one or more processors and/or circuitry which functions as a processor that processes the signals output from the image sensor, wherein, in pixels having a first arrangement among the plurality of pixels, a direction of arranging the pair of first semiconductor regions and the pair of second semiconductor regions is a first direction which is a row direction, wherein, in pixels having a second arrangement among the plurality of pixels, a direction of arranging the pair of first semiconductor regions is a second direction which is orthogonal to the first direction and a direction of arranging the pair of second semiconductor regions is the first direction, and a crosstalk ratio between the first semiconductor regions of the pixels having the second arrangement is made smaller than a crosstalk ratio between the first semiconductor regions of the pixels having the first arrangement, and wherein, in the pair of first semiconductor regions in the second arrangement, a potential gradient is formed such that electrons or holes generated in the pair of first semiconductor regions move toward the pair of second semiconductor regions and the potential gradient is made steeper than a potential gradient in the pair of first semiconductor regions in the first arrangement.

11. An image capturing apparatus comprising:

an image sensor comprising a plurality of pixels arranged in a matrix, from which signals of the pixels are read out in units of rows, wherein the plurality of pixels comprise:

a plurality of microlenses;

for each of the plurality of microlenses, a pair of first semiconductor regions formed at a first depth from a surface on which light is incident;

a pair of second semiconductor regions formed at a second depth deeper than the first depth; and a plurality of connecting regions that connect the pair of first semiconductor regions and the pair of second semiconductor regions, respectively; and one or more processors and/or circuitry which functions as a processor that processes the signals output from the image sensor, wherein, in pixels having a third arrangement among the plurality of pixels, a direction of arranging the pair of first semiconductor regions and the pair of second semiconductor regions is a first direction which is orthogonal to a row direction, wherein, in pixels having a fourth arrangement among the plurality of pixels, a direction of arranging the pair of first semiconductor regions is a second direction which is orthogonal to the first direction and a direction of arranging the pair of second semiconductor regions is the first direction, and wherein, in the pair of first semiconductor regions in the fourth arrangement, a potential gradient is formed such that electrons or holes generated in the pair of first semiconductor regions move toward the pair of second semiconductor regions and the potential gradient is made steeper than a potential gradient in the pair of first semiconductor regions in the third arrangement.

* * * * *